United States Patent
Shi

(10) Patent No.: US 8,410,782 B2
(45) Date of Patent: Apr. 2, 2013

(54) SWITCH TESTING CIRCUIT

(75) Inventor: Yan Shi, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 348 days.

(21) Appl. No.: 12/820,081

(22) Filed: Jun. 21, 2010

(65) Prior Publication Data
US 2011/0254556 A1      Oct. 20, 2011

(30) Foreign Application Priority Data

Apr. 19, 2010  (CN) .......................... 2010 1 0150182

(51) Int. Cl.
*G01R 31/02* (2006.01)
(52) U.S. Cl. ........................................... 324/415
(58) Field of Classification Search .................. 324/416, 324/750.3, 522, 415–42, 762.01, 762.08–762.084; 315/193
See application file for complete search history.

(56) References Cited

U.S. PATENT DOCUMENTS

| | | | |
|---|---|---|---|
| 5,969,626 A * | 10/1999 | Maciel | 340/649 |
| 2003/0112205 A1* | 6/2003 | Yamada | 345/32 |
| 2007/0096719 A1* | 5/2007 | Wang | 324/142 |
| 2007/0257880 A1* | 11/2007 | Nakao et al. | 345/102 |

* cited by examiner

*Primary Examiner* — Jeff Natalini
(74) *Attorney, Agent, or Firm* — Altis Law Group, Inc.

(57) ABSTRACT

A switch testing circuit is configured for testing a switch. The switch testing circuit includes a switch element, a first light emitting diode, and a control chip. The first light emitting diode, the switch element, and the switch are connected in series. The first light emitting diode is configured for indicating connection condition between the switch and the switch testing circuit. The control chip is configured for acquiring a voltage from one terminal of the switch element and comparing the acquired voltage with a comparison voltage to judge whether the switch is qualified or disqualified according to the comparison result.

10 Claims, 1 Drawing Sheet

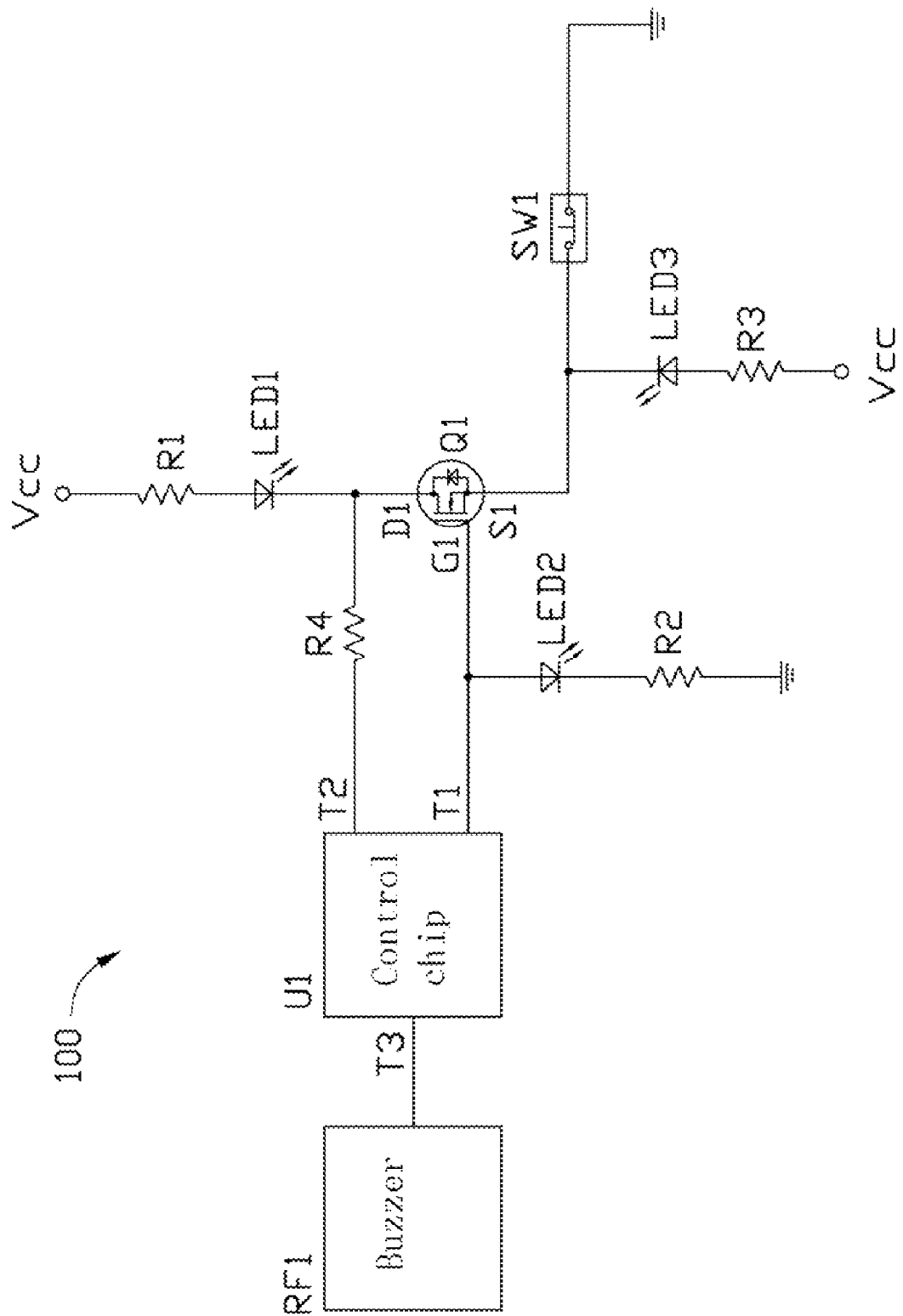

SWITCH TESTING CIRCUIT

BACKGROUND

1. Technical Field

The present disclosure relates to testing circuits and, particularly, to a switch testing circuit capable of timely and accurately testing whether a switch is working or not.

2. Description of Related Art

Many switches need to be tested before delivery of the product they are installed in. One of important tests is for reliability of the switches. Reliability is often tested by using a test machine to automatically turn the switches on and off thousands of times. However, a testing circuit connected to the switch may become disconnected during testing and report an erroneous result.

Therefore, it is desirable to provide a switch testing circuit which can overcome the limitations described above.

BRIEF DESCRIPTION OF THE DRAWINGS

Many aspects of the embodiments can be better understood with reference to the following drawing. The components in the drawing are not necessarily drawn to scale, the emphasis instead being placed upon clearly illustrating the principles of the present embodiments.

The drawing is a circuit diagram of a switch testing circuit in accordance with an exemplary embodiment.

DETAILED DESCRIPTION

Embodiments of the disclosure will now be described in detail, with reference to the accompanying drawing.

Referring to the drawing, a switch testing circuit 100, according to an exemplary embodiment, is configured for timely and accurately detecting whether a switch SW1 is working or not. In this embodiment, the switch SW1 is a single-pole single-throw switch. The switch testing circuit 100 includes a switch element Q1, a first light emitting diode LED1, a first resistor R1, a second light emitting diode LED2, a second resistor R2, a third light emitting diode LED3, a third resistor R3, a fourth resistor R4, a control chip U1, and a buzzer RF1.

The switch element Q1 includes a first terminal D1, a second terminal S1, and a control terminal G1 configured for controlling the connection between the first terminal D1 and second terminal S1. In this embodiment, the switch element Q1 is an n-channel metal oxide semiconductor (NMOS) transistor, wherein the first terminal D1 serves as a drain, the second terminal S1 serves as a source, and the control terminal G1 serves as a gate.

The first light emitting diode LED1 includes a cathode coupled to the first terminal D1 of the switch element Q1 and an anode coupled to one terminal of the first resistor R1. The other terminal of the first resistor R1 is coupled to a power source Vcc.

The second light emitting diode LED2 includes an anode connected to the control terminal G1 of the switch element Q1 and a cathode coupled to one terminal of the second resistor R2. The other terminal of the second resistor R2 is grounded.

The third light emitting diode LED3 includes a cathode connected to the second terminal S1 of the switch element Q1 and an anode coupled to one terminal of the third resistor R3. The other terminal of the third resistor R3 is coupled to the power source Vcc.

The control chip U1 is a single chip processor, and includes a signal terminal T1, a detecting terminal T2, and an alarm terminal T3. The signal terminal T1 is connected to the control terminal G1 of the switch element Q1. The detecting terminal T2 is coupled to the first terminal D1 of the switch element Q1 via the fourth resistor R4. The alarm terminal T3 is coupled to the buzzer RF1. A comparison voltage is predefines in the control chip U1 with an acceptable tolerance such as ±5%, indicating the switch SW1 is working properly.

It should be noted that the detecting terminal T2 of the control chip U1 can be coupled to the second terminal S1 of the switch element Q1.

During testing, one terminal of the switch SW1 is coupled to the second terminal S1 of the switch element Q1 and another terminal is grounded. The first light emitting diode LED1, the switch element Q1, and the switch form a loop (circuit). After the signal terminal T1 of the control chip U1 outputs a high level signal (e.g., logical "1") to the control terminal G1 of the switch element Q1, the switch SW1 is automatically turned on and turned off a preset number of times by a test machine. When the switch SW1 is turned on, the first terminal D1 and the second terminal S1 of the switch element Q1 is connected. The detecting terminal T2 of the control chip U1 acquires a voltage of the first terminal D1 of the switch element Q1. The control chip U1 compares the acquired voltage with the comparison voltage to determine whether the acquired voltage is within the acceptable range of the comparison voltage. When the acquired voltage is in the acceptable range of the comparison voltage, the switch SW1 is qualified. Otherwise, the switch SW1 is disqualified.

When the acquired voltage is out of the acceptable range of the comparison voltage during the testing process, the alarm terminal T3 of the control chip U1 outputs an alarm signal to the buzzer RF1. The buzzer RF1 buzzes.

The first, second, and third light emitting diodes LED1, LED2, and LED3 are included in the switch testing circuit 100. The first light emitting diode LED1 is configured to indicate the connection condition between the switch SW1 and the switch testing circuit 100, in other words whether the connection is broken. The second light emitting diode LED2 is configured to indicate when the signal is output from the signal terminal T1 of the control chip U1. The third light emitting diode LED3 cooperates with the first light emitting diode LED1 to indicate the working status of the switch testing circuit 100. As noted in the table below, is useful for troubleshooting the switch SW1 and the switch test circuit 100. For example, the connection between the switch SW1 and the switch testing circuit 100 is broken, the switch element Q1 is damaged, and so on.

Table 1 is different light conditions of the first, second, and third light emitting diodes LED1, LED2, and LED3 that indicate different connection conditions of the switch testing circuit 100 during testing.

TABLE 1

| LED1 | LED2 | LED3 | Connection Conditions |
|------|------|------|----------------------|
| ON   | ON   | ON   | Normal |
| OFF  | ON   | OFF  | Connection between the switch and the switch testing circuit is broken |
| OFF  | OFF  | ON   | The switch is short-circuited |
| ON   | OFF  | ON   | The switch element is short-circuited |
| OFF  | ON   | ON   | The switch element is broken |

It will be understood that particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A switch testing circuit configured for testing a switch, comprising:
    a switch element comprising a first terminal, a second terminal, and a control terminal for controlling the connection between the first terminal and the second terminal; wherein the second terminal of the switch element is connected to ground via the switch;
    a first light emitting diode comprising a cathode coupled to the first terminal of the switch element and an anode coupled to a power source, the first light emitting diode configured for indicating the connection condition between the switch and the switch testing circuit; and
    a control chip comprising a signal terminal coupled to the control terminal of the switch element and a detecting terminal coupled to one of the first terminal and the second terminal of the switch element;
    wherein when the switch testing circuit tests the switch, the control chip acquires a voltage of the first terminal of the switch element, compares the acquired voltage with a comparison voltage and determines whether the switch is qualified or disqualified according to the comparison.

2. The switch testing circuit in claim 1, wherein when the switch testing circuit tests the switch, the control trip outputs a control signal to the switch element and the switch element is switched on and off based on the control signal.

3. The switch testing circuit in claim 2, further comprising a second light emitting diode and a third light emitting diode, wherein the second light emitting diode comprises an anode coupled to the control terminal of the switch element and a cathode being grounded, when the switch testing circuit tests the switch, the second light emitting diode indicates when the control signal is outputted from the signal terminal of the control chip; wherein the third light emitting diode comprises a cathode coupled to the second terminal of the switch element and an anode coupled to the power source, the third light emitting diode and the first light emitting diode cooperatively indicates the working status of the switch testing circuit when the switch testing circuit tests the switch.

4. The switch testing circuit in claim 2, wherein the switch element is an n-channel metal oxide semiconductor (NMOS) transistor, the first terminal served as a drain, the second terminal served as a source, and the control terminal served as a gate.

5. The switch testing circuit in claim 2, wherein the comparison voltage defines a tolerance of acceptable range ±5%.

6. The switch testing circuit in claim 2, further comprising a buzzer, wherein the control chip further comprises an alarm terminal coupled to the buzzer, when the control chip determines that the switch is disqualified according to the comparison result, the alarm terminal of the control chip outputs an alarm signal to the buzzer, and the buzzer buzzes based on the alarm signal.

7. A switch testing circuit configured for testing a switch, comprising:
    a switch element comprising a control terminal for controlling connection of the switch element;
    a first light emitting diode, wherein the first light emitting diode and the switch are connected in series with the switch element, and wherein the first light emitting diode and the switch form a loop with the switch element; and
    a control chip comprising a signal terminal coupled to the control terminal of the switch element and a detecting terminal coupled to the loop;
    wherein when the switch testing circuit tests the switch, the control chip acquires a voltage of the loop, compares the acquired voltage with a comparison voltage, and determines whether the switch is qualified or disqualified according to the comparison.

8. The switch testing circuit of claim 7, wherein when the switch testing circuit tests the switch, the control trip outputs a control signal to the switch element and the switch element is switched on and off based on the control signal.

9. The switch testing circuit of claim 8, further comprising a buzzer, wherein the control chip further comprises an alarm terminal coupled to the buzzer, when the control chip determines that the switch is disqualified according to the comparison result, the alarm terminal of the control chip outputs an alarm signal to the buzzer, and the buzzer buzzes based on the alarm signal.

10. The switch testing circuit of claim 9, wherein the alarm terminal is directly connected to the buzzer.

* * * * *